United States Patent
Wang

(10) Patent No.: US 7,952,880 B2
(45) Date of Patent: May 31, 2011

(54) GRAPHICS CARD AND HEAT DISSIPATION METHOD THEREOF

(75) Inventor: Sheng-Hung Wang, Taipei (TW)

(73) Assignee: Asustek Computer Inc., Peitou, Taipei (TW)

( * ) Notice: Subject to any disclaimer, the term of this patent is extended or adjusted under 35 U.S.C. 154(b) by 204 days.

(21) Appl. No.: 12/365,232

(22) Filed: Feb. 4, 2009

(65) Prior Publication Data

US 2009/0213538 A1  Aug. 27, 2009

(30) Foreign Application Priority Data

Feb. 21, 2008  (TW) ................ 97106118 A

(51) Int. Cl.
  *H05K 7/20*  (2006.01)
  *F28F 7/00*  (2006.01)
  *H01L 23/34*  (2006.01)
  *F25B 21/02*  (2006.01)

(52) U.S. Cl. ........ 361/711; 361/704; 361/719; 361/709; 165/80.2; 165/185; 257/713; 62/3.2; 62/3.7

(58) Field of Classification Search .......... 361/704, 361/711, 715; 165/80.1–80.3, 185; 174/16.3, 174/15.4; 257/713, 722, E23.082; 62/3.2, 62/3.6; 136/205

See application file for complete search history.

(56) References Cited

U.S. PATENT DOCUMENTS

| 5,419,780 | A | * | 5/1995 | Suski | 136/205 |
| 5,457,342 | A | * | 10/1995 | Herbst, II | 257/712 |
| 2003/0184941 | A1 | * | 10/2003 | Maeda et al. | 361/103 |
| 2004/0261988 | A1 | * | 12/2004 | Sauciuc et al. | 165/185 |
| 2005/0160752 | A1 | * | 7/2005 | Ghoshal et al. | 62/259.2 |
| 2005/0236028 | A1 | * | 10/2005 | Strnad | 136/201 |
| 2006/0107987 | A1 | * | 5/2006 | Chen et al. | 136/205 |
| 2007/0234740 | A1 | * | 10/2007 | Lee et al. | 62/3.2 |
| 2007/0283702 | A1 | * | 12/2007 | Strnad | 62/3.2 |
| 2009/0151765 | A1 | * | 6/2009 | Han et al. | 136/201 |
| 2010/0101236 | A1 | * | 4/2010 | Shah et al. | 62/3.2 |

FOREIGN PATENT DOCUMENTS

| CN | 2763756 | 3/2006 |
| CN | 1779599 | 5/2006 |

OTHER PUBLICATIONS

English language translation of abstract of CN 2763756 (published Mar. 8, 2006).
English language translation of abstract of CN 1779599 (published May 31, 2006).

* cited by examiner

*Primary Examiner* — Zachary M Pape
(74) *Attorney, Agent, or Firm* — Thomas, Kayden, Horstemeyer & Risley, LLP

(57) ABSTRACT

A graphics card includes a graphics processing unit (GPU), a heat dissipation fin, an electric cooling module and a thermoelectric generator. The electric cooling module has a cold side and a hot side. The cold side contacts the GPU, and the hot side contacts the heat dissipation fin. The thermoelectric generator contacts the heat dissipation fin and is electrically connected to the electric cooling module. Furthermore, a method for dissipating the heat of the graphics card is also disclosed herein.

7 Claims, 1 Drawing Sheet

US 7,952,880 B2

GRAPHICS CARD AND HEAT DISSIPATION METHOD THEREOF

RELATED APPLICATIONS

This application claims priority to Taiwan Application Serial Number 97106118, filed Feb. 21, 2008, which is herein incorporated by reference.

BACKGROUND OF THE INVENTION

1. Field of the Invention

The invention relates to a graphics card and, more particularly, to a graphics card having a heat dissipation system.

2. Description of the Related Art

A graphics card is one of the basic components of a personal computer, and it is mostly used to provide a scan signal for a display to display a needed image.

In the conventional technology, the graphics card is mostly used to convert the display signal sent out by a computer to a scan signal. Along with the development of the science and technology, the graphics card often needs to further provide a three dimensional algorithm function and a graphics acceleration function besides providing the scan signal.

The workload of the graphics card becomes heavier and heavier, and therefore, the core of the graphics card, namely a graphics processing unit (GPU) generates very much heat. To dissipate the heat, although suppliers increase sizes of fans and enhances functions of the fans, the method of increasing the sizes and enhancing the functions of the fans cannot instantly solve the heat dissipation problem along with the increase of the workload of the GPU, and the noise generated by the fans causes a new problem.

BRIEF SUMMARY OF THE INVENTION

One objective of the invention is to provide a graphics card that utilizes an electric cooling module to dissipate the heat of a graphics processing unit and allows the heat energy to be transformed to electric energy to be transmitted to the electric cooling module.

According to the invention, a graphics card includes a graphics processing unit, a heat dissipation fin, an electric cooling module and a thermoelectric generator. The electric cooling module has a cold side and a hot side. The cold side contacts the GPU, and the hot side contacts the heat dissipation fin. The thermoelectric generator contacts the heat dissipation fin and is electrically connected to the electric cooling module.

The invention further provides a method for dissipating the heat of a graphics card.

The method for dissipating the heat of the graphics card of the invention includes the steps of transmitting the heat energy generated by a graphics processing unit to a thermoelectric generator from a cold side of an electric cooling module, transforming the heat energy to electric energy via the thermoelectric generator and transmitting the electric energy to the electric cooling module.

DETAILED DESCRIPTION OF THE EMBODIMENTS

Figure 1:
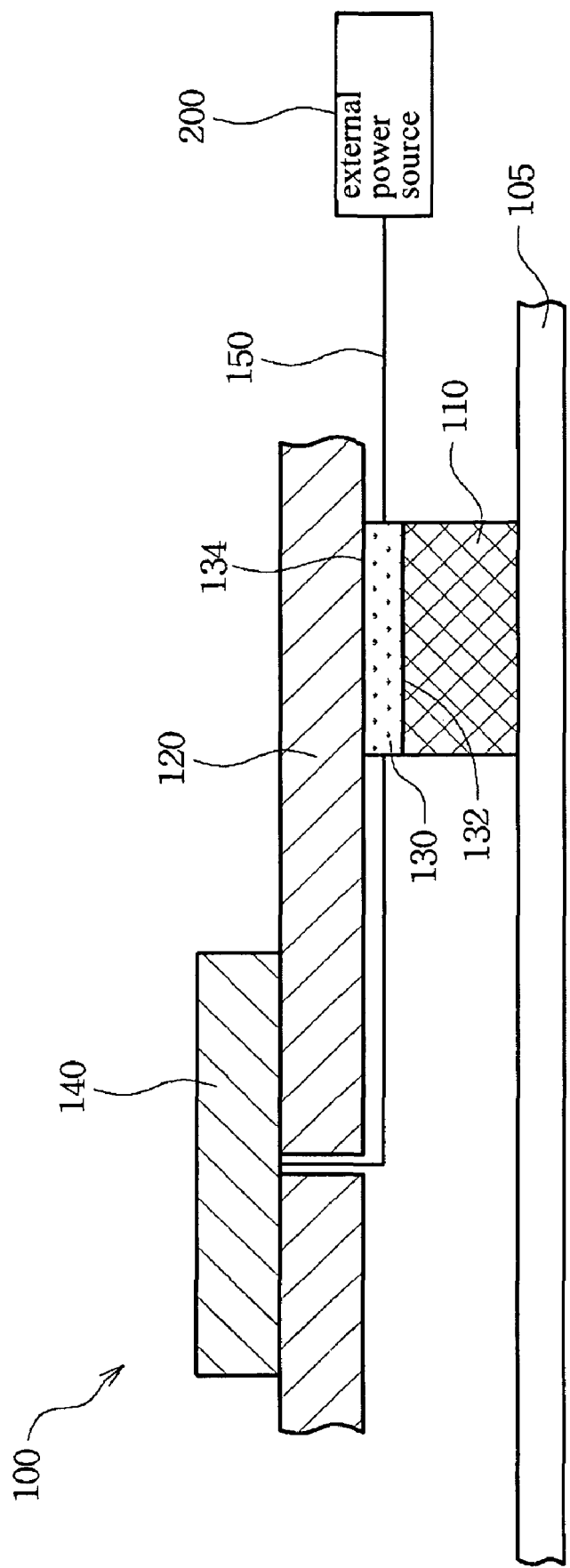
FIG. 1 is a sectional arrangement drawing showing a graphics card according to one embodiment of the invention.

An electric cooling module can be used to reduce the temperature of a graphics processing unit, but the power consumption of the electric cooling module is very great. A graphics card and a method for dissipating the heat thereof are disclosed in the following embodiment of the invention and mostly utilize a thermoelectric generator to recycle the heat of the GPU and transform the recycled heat to electric energy, and the electric energy is transmitted to the electric cooling module to allow the electric cooling module not to absolutely depend on an external power source.

FIG. 1 is a sectional arrangement drawing showing a graphics card according to one embodiment of the invention. As shown in FIG. 1, a graphics card 100 includes a GPU 110, a heat dissipation fin 120, an electric cooling module 130 and a thermoelectric generator 140. The GPU 110 is installed on a printed circuit board 105. The electric cooling module 130 has a cold side 132 and a hot side 134. The cold side 132 contacts the GPU 110, and the hot side 134 contacts the heat dissipation fin 120. The thermoelectric generator 140 contacts the heat dissipation fin 120 and is electrically connected to the electric cooling module 130.

The heat energy generated by the GPU 110 can be transmitted from the cold side 132 of the electric cooling module 130 to the thermoelectric generator 140 via the heat dissipation fin 120. The thermoelectric generator 140 transforms the heat energy to the electric energy and transmits the electric energy to the electric cooling module 130 to allow the electric cooling module 130 not to absolutely depend on an external power source 200.

Specifically, the electric cooling module 130 may include a plurality of crisscrossing arranged P-type semiconductors and N-type semiconductors and utilizes the Peltier effect to generate a temperature difference. The so-called Peltier effect is that the temperature rises at one junction and drops at the other junction when a current flows through two conductors of different material. Furthermore, when a direct current flows through the electric cooling module 130, one side of the electric cooling module 130 absorbs the heat and the other side of the electric cooling module 130 releases the heat because of the Peltier effect. The cold side is the side of the electric cooling module 130 that absorbs the heat when the direct current flows through the electric cooling module 130, and the hot side is the side of the electric cooling module 130 that releases the heat when the direct current flows through the electric cooling module 130.

Since the Peltier effect is reversible, the thermoelectric generator 140 in FIG. 1 also may include two different types of semiconductors that are arranged in an interlaced fashion, and the temperature difference at two sides of the thermoelectric generator 140 is used to create electric energy via the Peltier effect.

To sufficiently provide the needed electricity energy for the electric cooling module 130, the graphics card 100 in FIG. 1 further includes a power cable 150, and the power cable 150 electrically connects the electric cooling module 130 to an external power source 200 to allow the external power source 200 to cover the shortage of the thermoelectric generator 140. In the embodiment, the external power source 200 may be a power supplier or other direct current power source.

The area of the thermoelectric generator 140 may be larger than the area of the electric cooling module 130. In the embodiment, if the ratio of the area of the thermoelectric generator 140 to the area of the electric cooling module 130 is above 8:1, the electric cooling module 130 can use the electric energy provided by the thermoelectric generator 140 only without using the direct current provided by the external power source 200.

In the embodiment, the heat dissipation fin 120 may be made of metal, but it is not limited in the invention. Other heat conducting material also can be used to produce the heat dissipation fin, and persons having ordinary skill in the art can flexibly select the mode of implementing the heat dissipation fin according to an actual requirement.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A graphics card comprising:

a graphics processing unit (GPU);

a heat dissipation fin;

an electric cooling module having a cold side and a hot side, wherein the cold side contacts the GPU, and the hot side contacts the heat dissipation fin; and a thermoelectric generator contacting the heat dissipation fin and electrically connected to the electric cooling module, wherein the heat dissipation fin is disposed between the thermoelectric generator and the electric cooling module, and the heat dissipation fin directly contacts the thermoelectric generator and the electric cooling module.

2. The graphics card according to claim 1 further comprising:

a power cable electrically connecting the electric cooling module to an external power source.

3. The graphics card according to claim 1, wherein the area of the thermoelectric generator is larger than the area of the electric cooling module.

4. The graphics card according to claim 1, wherein the heat dissipation fin is made of metal.

5. A method for dissipating the heat of a graphics card, the method comprising the steps of:

transmitting heat energy generated by a graphics processing unit to a thermoelectric generator from a cold side of an electric cooling module through a heat dissipation fin;

transforming the heat energy to electric energy via the thermoelectric generator, wherein the heat dissipation fin is disposed between the thermoelectric generator and the electric cooling module, and the heat dissipation fin directly contacts the thermoelectric generator and the electric cooling module; and transmitting the electric energy to the electric cooling module.

6. The method for dissipating the heat of the graphics card according to claim 5 further comprising the step of:

electrically connecting the electric cooling module to an external power source.

7. The method for dissipating the heat of the graphics card according to claim 5, wherein the area of the thermoelectric generator is larger than the area of the electric cooling module.

* * * * *